United States Patent
Lu

(12) United States Patent          (10) Patent No.: US 7,453,971 B2
Lu                                       (45) Date of Patent:    Nov. 18, 2008

(54) SAMPLING-ERROR PHASE COMPENSATING APPARATUS AND METHOD THEREOF

(75) Inventor: Chao-Hsin Lu, Tao-yuan (TW)

(73) Assignee: Realtek Semiconductor Corp., Hsinchu ( * ) Notice: Subject to any disclaimer, the term of this patent is extended or adjusted under 35 U.S.C. 154(b) by 0 days.

(21) Appl. No.: 11/865,874

(22) Filed: Oct. 2, 2007

(65) Prior Publication Data

US 2008/0025453 A1     Jan. 31, 2008

Related U.S. Application Data

(63) Continuation of application No. 10/845,023, filed on May 13, 2004.

(30) Foreign Application Priority Data

Jun. 13, 2003    (TW)   .............................. 92116179 A

(51) Int. Cl.
     *H04L 7/00*        (2006.01)
(52) U.S. Cl. ...................... 375/371; 327/141; 358/409; 358/410; 370/503; 713/400; 714/12
(58) Field of Classification Search ................... 375/371
See application file for complete search history.

(56) References Cited

U.S. PATENT DOCUMENTS

| | | | |
|---|---|---|---|
| 4,414,676 A | 11/1983 | Kraul et al. | |
| 5,404,379 A | 4/1995 | Shyue et al. | |
| 5,450,452 A * | 9/1995 | Kakuishi et al. | ............ 375/376 |
| 5,905,769 A | 5/1999 | Lee et al. | |
| 6,573,698 B2 | 6/2003 | Eto | |
| 6,959,062 B1 * | 10/2005 | Stubbs | ....................... 375/376 |

\* cited by examiner

*Primary Examiner*—Shuwang Liu
*Assistant Examiner*—Dhaval Patel
(74) *Attorney, Agent, or Firm*—Thomas, Kayden, Horstemeyer & Risley

(57) ABSTRACT

A sampling-error phase compensating device and a method thereof for sequentially sampling data signals and outputting sampled data signals. The method sequentially includes: sampling each data signal according to a first sampling clock signal, and sequentially outputting corresponding phase detection signals according to the sampled data signals; sequentially outputting phase regulating signals, which correspond to the phase detection signals, respectively, according to the phase detection signals, wherein when the phase detection signals are the same, the phase regulating signals includes first-state phase regulating signals and second-state phase regulating signals, the first-state phase regulating signals correspond to the phase detection signals, and the number of the second-state phase regulating signals is smaller than that of the first-state phase regulating signals; and sequentially outputting second sampling clock signals according to the phase regulating signals, wherein phases of the sampling clock signals correspond to those of the phase regulating signals, respectively.

21 Claims, 8 Drawing Sheets

| | Phase detection | Phase regulation | Sampling clock | Phase error |
|---|---|---|---|---|
| T0 | | | | −0.5 |
| T1 | + | | | −0.5 |
| T2 | + | + | | −0.5 |
| T3 | + | + | + | +0.5 |
| T4 | + | + | + | +1.5 |
| T5 | − | + | + | +2.5 |
| T6 | − | − | + | +3.5 |
| T7 | − | − | − | +2.5 |
| T8 | − | − | − | +1.5 |
| T9 | − | − | − | +0.5 |
| T10 | − | − | − | −0.5 |
| T11 | + | − | − | −1.5 |
| T12 | + | + | − | −2.5 |

| | Phase detection | Second Phase regulation | Third phase regulation | Sampling clock | Phase error |
|---|---|---|---|---|---|
| T0 | | | | | -0.5 |
| T1 | - | | | | -0.5 |
| T2 | - | - | | | -0.5 |
| T3 | - | - | -1 | | -0.5 |
| T4 | - | ⊕ | -2 | | -0.5 |
| T5 | - | - | -1 | | -0.5 |
| T6 | - | - | -2 | | -0.5 |
| T7 | - | ⊕ | -3 ⇒ 0 | | -0.5 |
| T8 | - | - | +1 | + | -0.5 |
| T9 | + | - | 0 | | +0.5 |
| T10 | + | + | -1 | | +0.5 |
| T11 | + | + | 0 | | +0.5 |
| T12 | + | ⊖ | +1 | | +0.5 |
| T13 | + | + | 0 | | +0.5 |
| T14 | + | + | +1 | | +0.5 |
| T15 | + | ⊖ | +2 | | +0.5 |
| T16 | + | + | +1 | | +0.5 |
| T17 | + | + | +2 | | +0.5 |
| T18 | + | ⊖ | +3 ⇒ 0 | | +0.5 |
| T19 | + | + | -1 | - | +0.5 |
| T20 | - | + | 0 | | -0.5 |

FIG. 8

SAMPLING-ERROR PHASE COMPENSATING APPARATUS AND METHOD THEREOF

This is a Continuation of U.S. application Ser. No. 10/845,023, filed May 13, 2004.

BACKGROUND OF THE INVENTION

1. Field of the Invention

The invention relates to a sampling-error phase compensating device and a method thereof, and more particularly to a sampling-error phase compensating device and a method thereof, both of which are applied to a data recovery system.

2. Description of the Related Art

In a data recovery system, a sampling circuit is needed to sample data signals. FIGS. 1A to 1D are schematic illustrations showing the operation principle for a sampling circuit. As shown in FIGS. 1A to 1D, the data signals are a series of continuous signals with specific working frequency, and the sampling circuit samples the data signals at sampling points according to a sampling clock signal. When the sampling point is positioned at a middle portion in each segment of the data signal, as shown at the sampling point P1 of FIG. 1A, the sampling error of the sampled data signal obtained by the sampling of the sampling circuit tend to be small. However, if the sampling point is not positioned at the middle portion in each segment of the data signal but at a transition portion, as shown at the sampling point P2 of FIG. 1B, the sampled data signal obtained by the sampling of the sampling circuit may induce serious sampling error because the signal value of the data signal at the transition portion is not stable. When the sampling point is at the front portion in each period of the data signal, as shown in FIG. 1C, it is termed "phase leading" of the sampling point. When the sampling point is at the rear portion in each period of the data signal, as shown in FIG. 1D, it is termed "phase lagging" of the sampling point. The position (i.e., phase) of each sampling point in the data signal may influence the sampling error of the sampled signal, and thus cause great influence on the operation of the data recovery system. Consequently, how to decrease the sampling error in the data recovery system is a very important subject.

The typical sampling circuits applied to the data recovery system may be divided into two categories, which are feedforward sampling circuits and feedback sampling circuits. The operation principle of the feedforward sampling circuit is to utilize an over-sampling unit to over-sample the input data signals. That is, each data signal is sampled for multiple times. Then, a phase regulator selects correctly sampled data signals for output according to the magnitudes of multiple over-sampled data signals corresponding to each data signal. However, the feedforward sampling circuit is not suitable for the data recovery system having data signals with high working frequency because the sampling frequency of the over-sampling circuit is far higher than the working frequency of the data signal.

FIG. 2 is a schematic illustration showing a conventional feedback sampling circuit. The conventional feedback sampling circuit 200 typically utilizes a phase detector 210 and a phase regulator 230. In addition to performing the function of sampling on the data signal, the phase detector 210 detects the phase of the sampling point imposed by a sampling clock signal at each period of the data signal so as to output a phase detection signal. Then the phase regulator 230 adjusts the sampling clock signal of the phase detector 210 according to the phase detection signal, usually filtered by a digital loop filter 220, such that the phase leading or phase lagging of the sampling points causing sampling error can be properly adjusted.

However, due to time delay from detection of phase error to adjustment of sampling clock signal inherent in electronic circuits, the feedback sampling circuit tends to over-adjust the sampling clock signal. This results in a relatively large swing range of the magnitude of phase errors, and therefore may induce even more serious sampling error.

FIG. 3 is a schematic illustration showing the operation of the conventional feedback sampling circuit. As shown in FIG. 3, the phase detection, phase regulation and sampling clock on the horizontal axis represent output signals of the phase detector, the digital loop filter and the phase regulator in the feedback sampling circuit, respectively, wherein "+" represents that the signal is to regulate the sampling point forward on the phase of the data signal, and "−" represents that the signal is to regulate the sampling point backward on the phase of the data signal. The phase error represents the extent of the error of the sampling point on the phase of the data signal, wherein "+" represents the phase leading and "−" represents the phase lagging. The conventional feedback sampling circuit of FIG. 2 is a pipeline circuit. When the phase detector detects the phase of the sampling point lags behind 0.5 units at time T0, the phase regulator will not correspondingly regulate the phase of the sampling clock signal according to the phase error after three units of time have been elapsed (i.e., at time T3). The pipeline circuit structure of the feedback sampling circuit causes the time delay from the time when the phase detector detects the phase error to another time when the phase regulator regulates the sampling clock signal according to the phase error. The length of the delay time is determined by the circuit architecture of the conventional feedback sampling circuit. The more the number of circuit components of the pipeline circuit is, the longer the delay time is. This is one of the drawbacks of the conventional feedback sampling circuit. In the above-mentioned, conventional feedback sampling circuit, the delay time k=3. However, in the practical data recovery system, the problem of the time delay is more serious than that in the circuit of FIG. 2, and thus k is usually greater than 3. In addition, when the phase detector detects the phase error at time T0, the phase regulator will not regulate the phase of the sampling clock signal according to the phase error after three units of time have been elapsed (i.e., at time T3). So, the phase detection signal is kept at "+" at time T2 and T3, and these "+" signals regulate the sampling clock at time T4 and T5, respectively. That is, since the drawback of time delay exists in the conventional feedback sampling circuit having the pipeline circuit structure as shown in FIG. 2, the feedback circuit continuously over-regulates the phase of the sampling clock signal as long as the phase error, regardless of its magnitude, does exist. In this context, the phenomenon is referred to as the accumulative regulation. Even if the initial phase error is smaller than one unit (−0.5), the circuit of FIG. 2 continuously regulates the phase of the sampling clock signal at least three times, thereby causing the magnitude of the phase error of the conventional feedback sampling circuit to swing between a large range (+3.5 to −2.5), as shown in FIG. 4. Consequently, the conventional feedback sampling circuit may even cause more serious sampling errors during its sampling-error phase regulation process. In particular, if the delay time is too long, the magnitude of the phase error may be caused to diverge, and thus the compensation cannot be made.

Thus, it is necessary to overcome the drawback in the conventional phase detection system.

SUMMARY OF THE INVENTION

It is therefore one of the many objects of the invention to provide a sampling-error phase compensating apparatus and a method thereof, both of which may be applied to a data recovery system, and capable of minimizing the over-adjusting phenomenon.

The invention achieves the above-identified object by providing a sampling-error phase compensating method for sequentially sampling a plurality of data signals and outputting a plurality of sampled data signals. The method includes the following steps. First, each of the data signals is sampled according to a first sampling clock signal and a plurality of corresponding phase detection signals is sequentially output according to the sampled data signals. Next, when an absolute value of the phase detection signal is smaller than a first default value, a plurality of first phase regulating signals is sequentially output according to the phase detection signals. The first phase regulating signals respectively correspond to the phase detection signals. When the phase detection signals are the same, the phase regulating signals includes a plurality of first-state first phase regulating signals and a plurality of second-state first phase regulating signals. The first-state first phase regulating signals correspond to the phase detection signals, and the number of the second-state first phase regulating signals is smaller than that of the first-state first phase regulating signal. Then, a second phase regulating signal is correspondingly output according to the first phase regulating signals. Furthermore, when the absolute value of the phase detection signal is greater than the first default value, a plurality of third phase regulating signals is correspondingly output according to the phase detection signals. Finally, a second sampling clock signal is output according to the second phase regulating signal or the third phase regulating signal, wherein the phase of the sampling clock signal corresponds to the second phase regulating signal.

The invention also achieves the above-identified object by providing a sampling-error phase compensating device for sequentially sampling a plurality of data signals and outputting a plurality of sampled data signals. The device includes a phase detector, a first digital loop filter, a second digital loop filter, a third digital loop filter, a selector, and a phase regulator. The phase detector samples each of the data signals according to a first sampling clock signal and sequentially outputs a plurality of corresponding phase detection signals according to the sampled data signals. The first digital loop filter sequentially outputs a plurality of first phase regulating signals according to the phase detection signals. The first phase regulating signals respectively correspond to the phase detection signals. When the phase detection signals are the same, the phase regulating signals include a plurality of first-state first phase regulating signals and a plurality of second-state first phase regulating signals. The first-state first phase regulating signals correspond to the phase detection signals, and the number of the second-state first phase regulating signals is smaller than that of the first-state first phase regulating signals. The second digital loop filter outputs a corresponding second phase regulating signal according to the first phase regulating signals. The third digital loop filter outputs corresponding third phase regulating signals according to the phase detection signals. The selector selects and outputs the phase detection signals to the first digital loop filter or the third digital loop filter according to the phase detection signal. The phase regulator outputs a second sampling clock signal according to the second phase regulating signal or the third phase regulating signal, wherein the phase of the second sampling clock signal corresponds to the second phase regulating signal.

Other objects, features, and advantages of the invention will become apparent from the following detailed description of the non-limiting embodiments. The following description is made with reference to the accompanying drawings.

BRIEF DESCRIPTION OF THE DRAWINGS

FIG. 8 is an illustration showing the operation of the sampling-error phase compensating apparatus according to an embodiment of the invention.

DETAILED DESCRIPTION OF EMBODIMENTS

The embodiments of the invention will be described with reference to the accompanying drawings.

Figure 5:
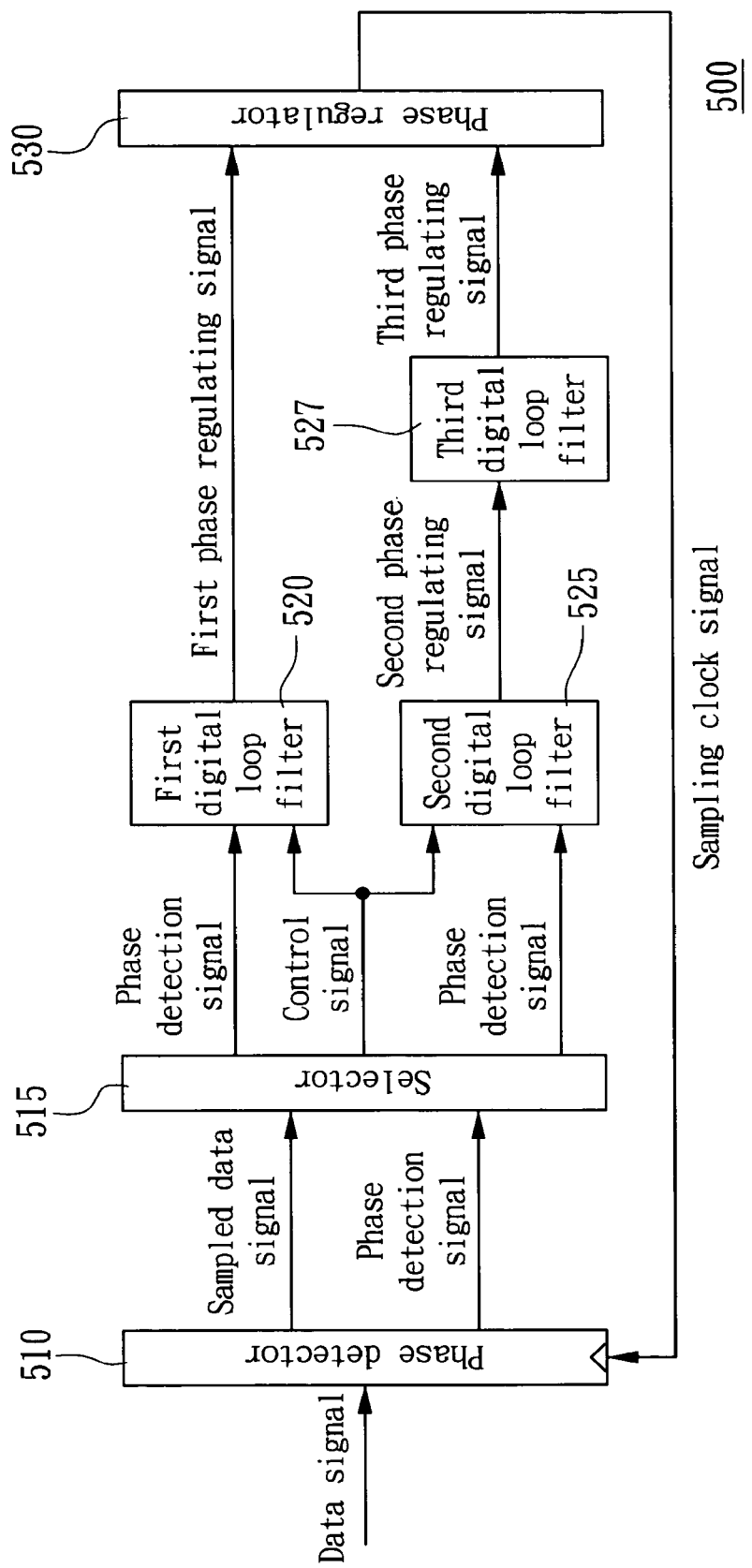
FIG. 5 is a functional block diagram showing a sampling-error phase compensating apparatus according to an embodiment of the invention.

FIG. 5 is a functional block diagram showing a sampling-error phase compensating apparatus according to an embodiment of the invention, which may be applied to a data recovery system or the like. Referring to FIG. 5, the sampling-error phase compensating apparatus includes a phase detector 510, a selector 515, a first digital loop filter 520, a second digital loop filter 525, a third digital loop filter 527, and a phase adjusting unit 530.

Figure 6:
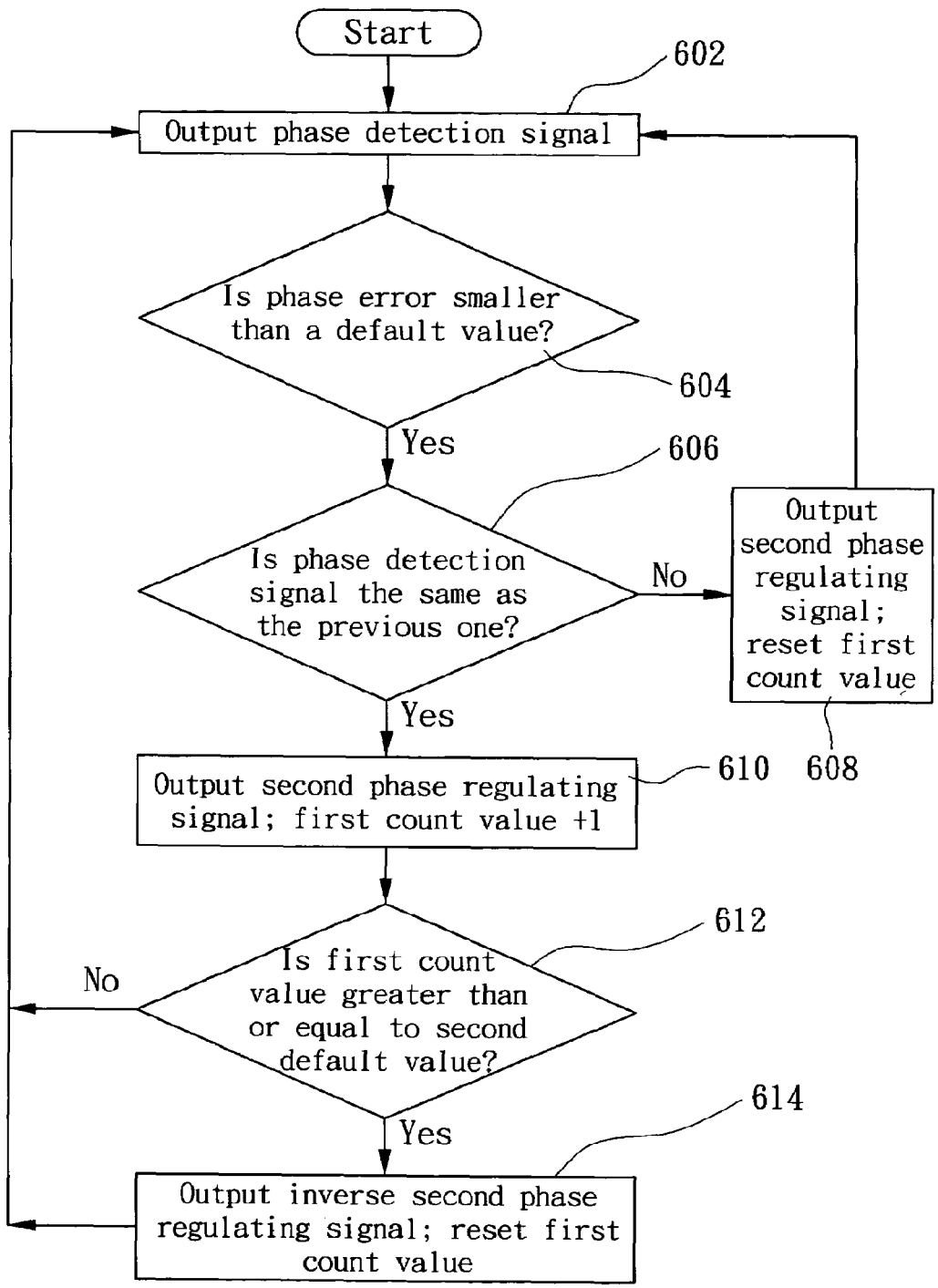
FIG. 6 is a flow chart showing the operation of a phase detector, a selector and a second digital loop filter in the sampling-error phase compensating apparatus according to an embodiment of the invention.

FIG. 6 is a flow chart showing operations of the phase detector 510, the selector 515 and the second digital loop filter 525 in the sampling-error phase compensating apparatus in FIG. 5. First, the phase detector 510 outputs a phase detection signal in step 602, wherein the phase detection signal represents the magnitude of the sampling error of the sampled data signal. Next, in step 604, it is determined whether or not the phase error is smaller than a first default value. The selector 515 determines whether or not the phase error is smaller than the first default value, such as ±1, according to the phase detection signal. If the phase error is greater than 1 or smaller than (−1), the phase detection signal is output to the first digital loop filter 520, or otherwise the phase detection signal is output to the second digital loop filter 525. The first and second digital loop filters 520 and 525 are phase regulating units and may output corresponding phase regulating signals according to the phase detection signal. The difference between the two digital loop filters 520 and 525 is that the first digital loop filter 520 performs a coarse regulation operation with respect to the larger phase error. When the phase error is smaller than a predetermined default value, the second digital loop filter 525 is utilized to perform a fine regulation operation with respect to the smaller phase error. The function and operation of the first digital loop filter 520 are substantially the same as those of the conventional digital loop filter 220 of FIG. 2, and detailed description thereof will be omitted. The operation of the second digital loop filter 525 will be described in detail in the following.

When the phase error is smaller than the first default value, the selector 515 outputs a new phase detection signal to the second digital loop filter 525. Next, step 606 is executed to determine whether or not the new phase detection signal is the same as the previous phase detection signal. The second digital loop filter 525 has a register for storing the previously received phase detection signal, and a first counter for counting the number of the received phase detection signals with the same state. After the second digital loop filter 525 receives the phase detection signal, the second digital loop filter 525 compares the received phase detection signal to the previous phase detection signal stored in the register. As mentioned above, the phase detection signal has a phase leading state and a phase lagging state. If the both of the two signals are the phase lagging signals or the phase leading signals, step 610 is executed to add one to a first count value of the first counter, and to output a corresponding second phase regulating signal according to the phase detection signal. If both of the two signals are different, step 608 is executed to reset the value of the first counter, and to output the corresponding second phase regulating signal according to the phase detection signal, and then the process goes back to step 602. The second phase regulating signal may represent three states of forward phase regulation, backward phase regulation and phase holding. When step 608 or 610 is executed, the second digital loop filter can output the corresponding second phase regulating signal according to the received phase detection signal. If the received phase detection signal represents the phase lagging, the output second phase regulating signal represents the forward phase regulation. On the contrary, if the received phase detection signal represents the phase leading, the output second phase regulating signal represents the backward phase regulation.

After the step 610 is executed, step 612 is executed to determine whether or not the first count value is greater than a second default value. The second digital loop filter 525 further has the second default value to be compared with the first count value. If the first count value is greater than or equal to the second default value, step 614 is executed to output the second phase regulating signal indicating an inverse state to that represented by the phase detection signal. If the first count value is smaller than the first default value, the process goes back to step 602.

Figures 3, 4:
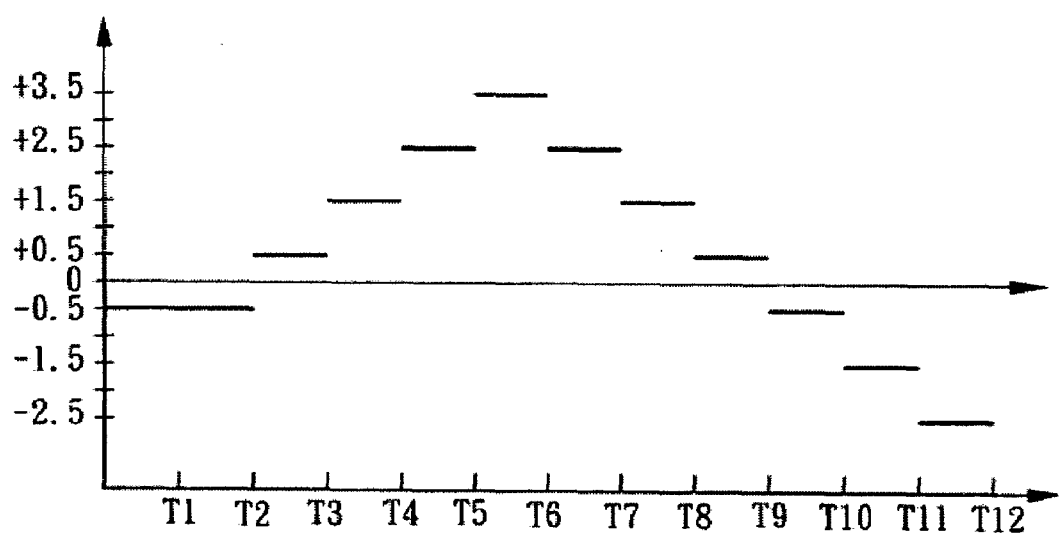
FIG. 3 is a schematic illustration showing the operation of the conventional feedback sampling circuit.
FIG. 4 is a schematic illustration showing sampling errors caused by the conventional feedback sampling circuit.

Please refer to FIGS. 3 and 4 and their corresponding descriptions mentioned above. The drawback of the conventional art is to cause the time delay from the time when the phase detector detects the phase error to another time when the phase regulator regulates the sampling clock signal according to the phase error because the conventional feedback sampling circuit has a pipeline circuit structure. The effect caused by the time delay is that the conventional art continuously outputs the corresponding phase detection signal according to the phase error as long as the phase error, regardless of its magnitude, does exist. Thus, the phase of the sampling clock signal will be regulated in an accumulative manner. In order to eliminate this drawback, a second default value is stored in the second digital loop filter 525 of the invention. In this embodiment, it is assumed that the second default value is 3. When the first count value is greater than or equal to 3, it means that the second digital loop filter 525 has received three phase detection signals with the same state, either phase leading state or phase lagging state, from the phase detector 510. When the first and second phase detection signals with the same state are received, the second digital loop filter 525 outputs the second phase regulating signal corresponding to the states of the two phase detection signals. However, in order to prevent the phase of the sampling clock signal from being regulated in an accumulative manner, the second digital loop filter 525 will execute step 614 after the third phase detection signal with the same state as those of the first and second phase detection signals is received. Under this condition, the phase of the output second phase regulating signal is inverse to the phase of each of the two second phase detection signals that are previously output. That is, if the previously output second phase regulating signal is a phase forward regulating signal, the presently output second phase regulating signal is a phase backward regulating signal. On the contrary, if the previously output second phase regulating signal is a phase backward regulating signal, the presently output second phase regulating signal is a phase forward regulating signal. The post-stage phase adjusting unit 530 inversely adjusts the phase of the sampling clock signal according to the inverse first phase regulating signal. Consequently, the drawback caused by the conventional art for accumulatively regulating the phase of the sampling clock signal may be eliminated.

As mentioned above, because the invention utilizes the second digital loop filter to output an inverse phase regulating signal with an inverse phase to that of the previously output phase regulating signal when several phase detection signals with the same state are continuously received. Thus, the phase error may be restricted to a minimum range, and it is possible to avoid the problem of the influence on the range of the phase error of the system owing to the conventional accumulative regulation caused by the time delay, and also to avoid the problem of the phase error divergence owing to the too-large range of the phase error.

It is to be noted that the magnitude of the second default value is preferably smaller than the magnitude of the time delay caused by the pipeline circuit architecture of the sampling-error phase regulator of the invention. That is, the second default value is set to 3 under the condition of time delay k>3 in this embodiment. In addition, in the condition where the second default value is greater, the second digital loop filter 525 may be configured to output "b" (b>1) inverse phase regulating signals after "a" phase detection signal with the same state as the previous state. However, the values of "a" and "b" must satisfy the condition of a>b. For example, when the second default value is equal to 5, two inverse phase regulating signals may be output after three phase detection signals with the same state are output. In addition, the so-called inverse phase regulating signal needs not to have an inverse state to the previously output phase regulating signal, but may be a phase hold signal.

Figure 7:
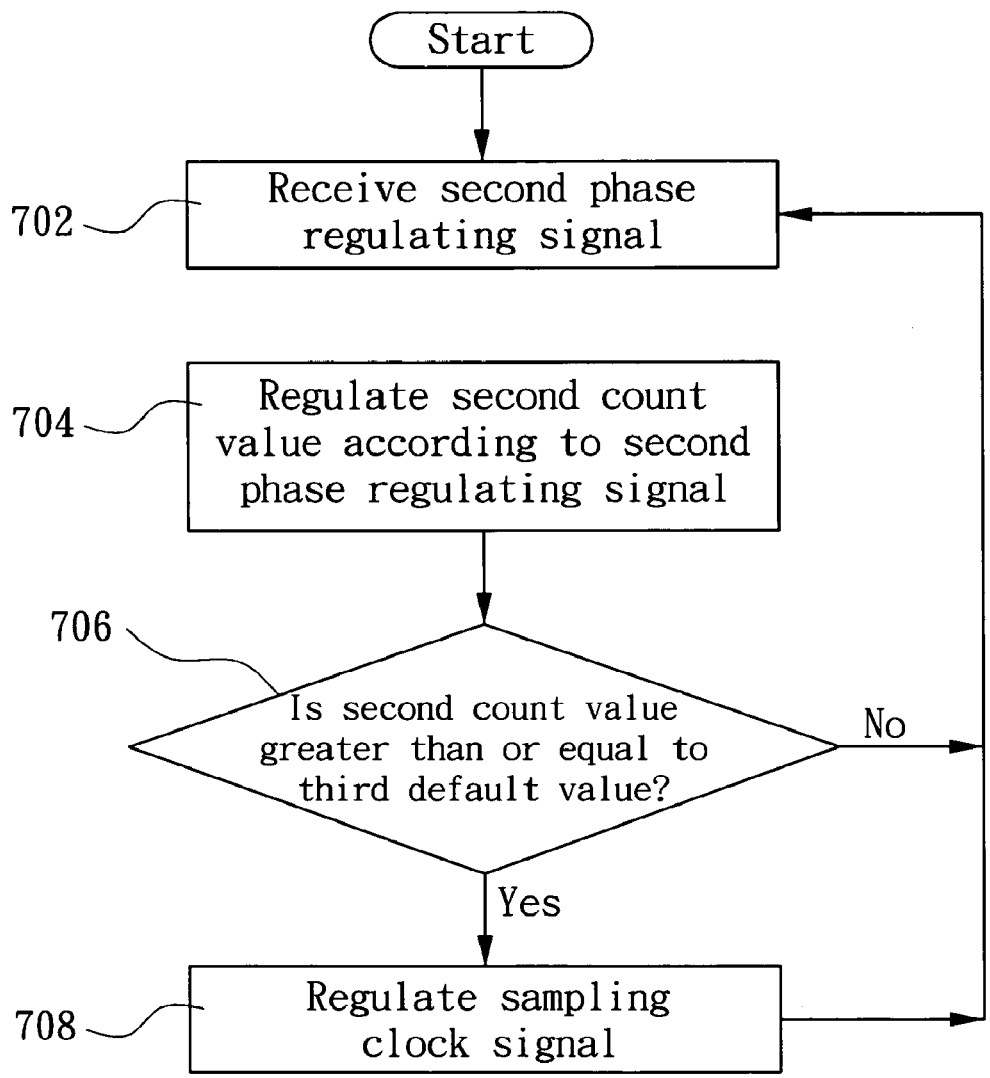
FIG. 7 is a flow chart showing the operations of a third digital loop filter in the sampling-error phase compensating apparatus according to an embodiment of the invention.

FIG. 7 is a flow chart showing the operations of a third digital loop filter 527 in the sampling-error phase compensating device of the invention. After step 702 is executed and the second phase regulating signal is received, step 704 is executed to regulate the second count value, according to second phase regulating signal. The third digital loop filter 527 has a second counter to count the second count value according to the state of the second phase regulating signal. As mentioned above, the second phase regulating signal has three states of forward phase regulation, backward phase regulation and phase holding, which states are respectively represented by "+", "−" and "0" in this embodiment. The third digital loop filter 527 changes the second count value according to the state of the second phase regulating signal. For example, if the phase forward regulating signal is received, (+1) is added to the second count value; if the phase backward regulating signal is received, (−1) is added to the second count value; and if the phase hold signal is received, the second count value is kept unchanged. Thereafter, step 706 is executed, in which the third digital loop filter 527 compares the second count value with a third default value (e.g., ±3) stored therein. When the second count value is greater than (+3) or smaller than (−3), a corresponding third phase regulating signal is output to the phase adjusting unit 530 according to the second phase regulating signal. On the contrary, when the second count value ranges between (+3) and (−3), the process goes back to step 702 to receive a next second phase regulating signal. The operation manner of the third digital loop filter 527 of this invention is to avoid the problem of the influence on the range of the phase error of the system owing to the conventional accumulative regulation caused by the time delay, and also to avoid the problem of the phase error divergence owing to the too-large range of the phase error. It is to be noted that the magnitude of the third default value has to be greater than the second default value.

Figure 1A:
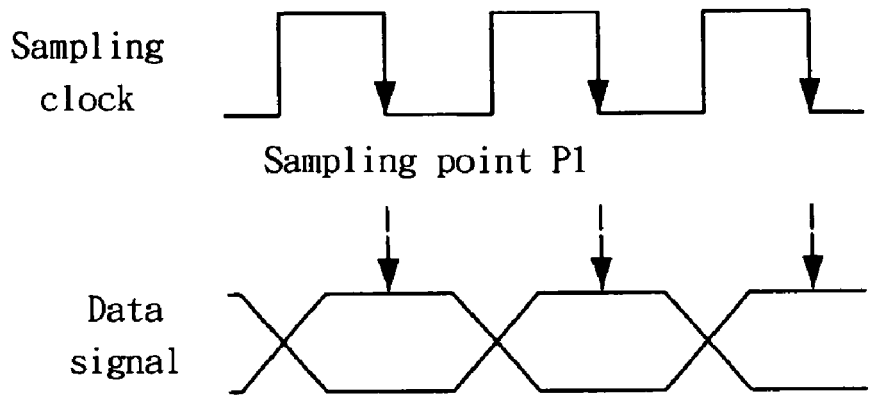
FIGS. 1A to 1D are schematic illustrations showing the operation principle for a sampling circuit.
Figure 1B:
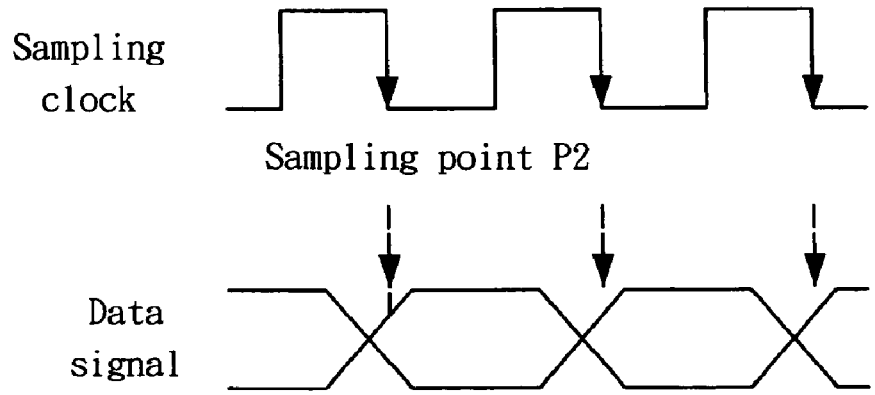
Figure 1C:
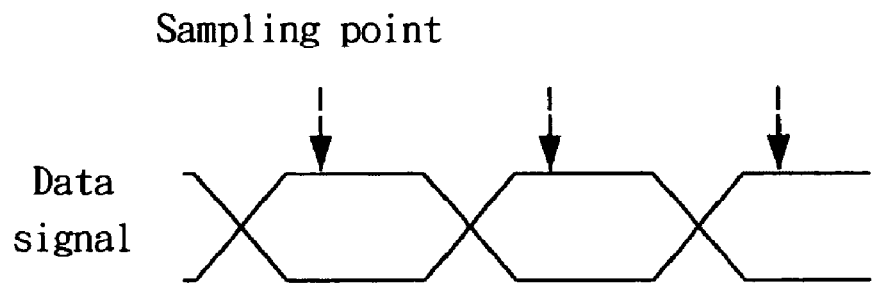
Figure 1D:
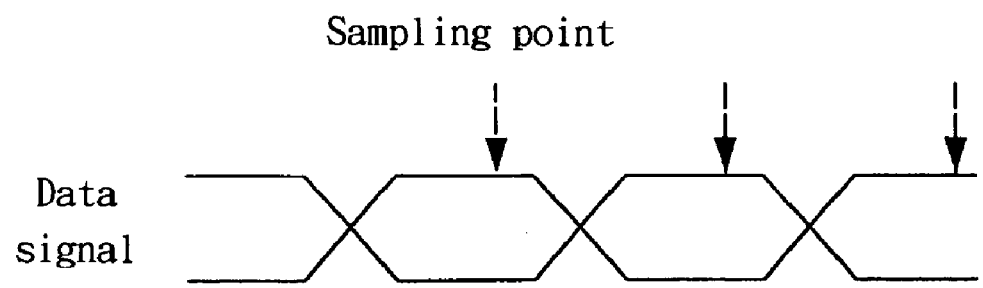
Figure 2:
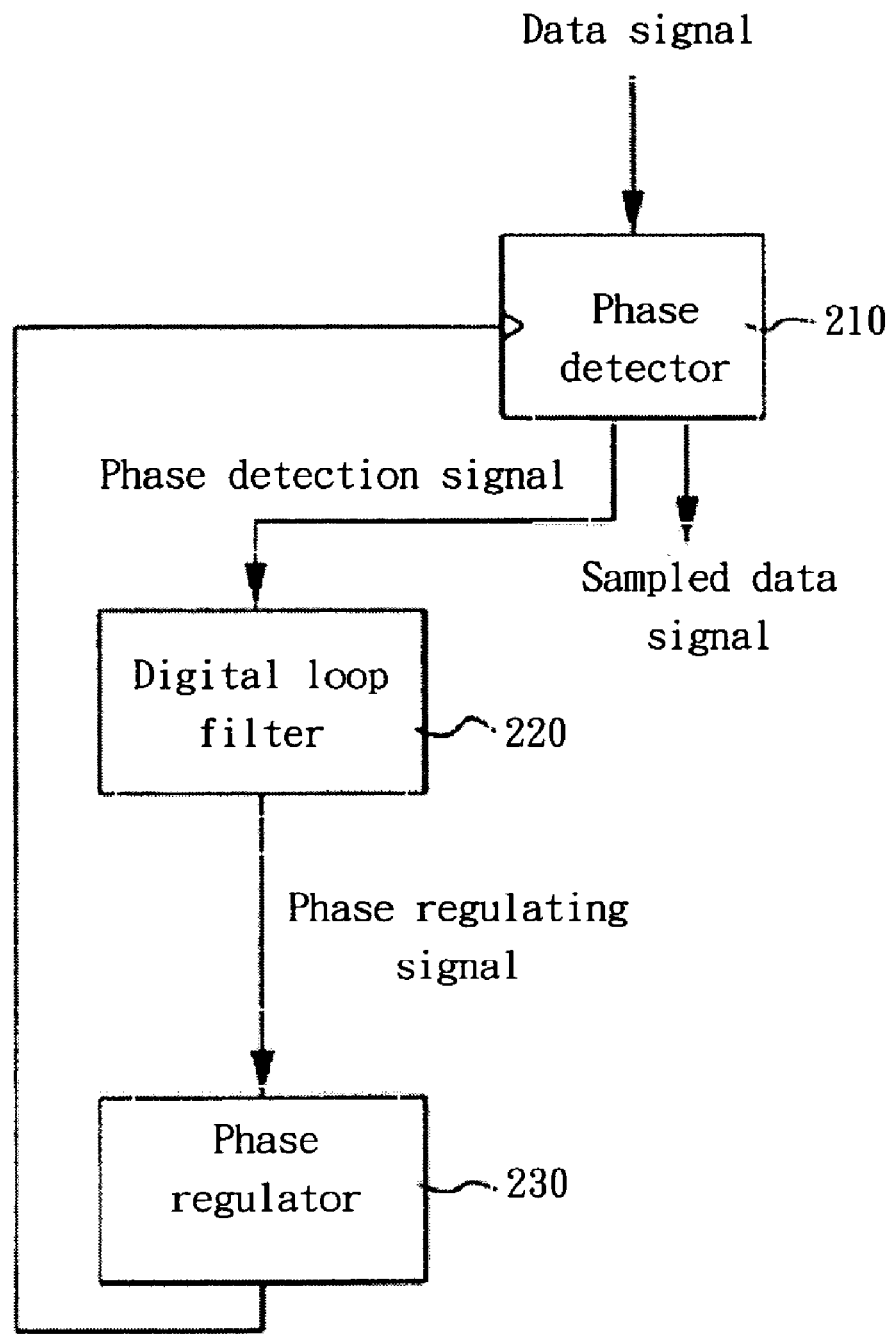
FIG. 2 is a schematic illustration showing a conventional feedback sampling circuit.

The phase adjusting unit 530 adjusts the phase of the sampling clock signal according to the received first or third phase regulating signal, and the operation principle and operation manner are the same as those of the conventional phase regulator 230 of FIG. 2, which have been described in the above, so detailed descriptions thereof will be omitted.

FIG. 8 is a schematic illustration showing the operation of the sampling-error phase compensating device of the invention. The phase detection, second phase regulation, third phase regulation and sampling clock on the horizontal axis respectively represent the output signals of the phase detector, second digital loop filter, third digital loop filter and phase adjusting unit, wherein "+" and "−" have the same meanings as those of FIG. 3, and detailed descriptions thereof may be found in the above-mentioned description. It is to be noted that the selector selects the phase detection signal and outputs it to the second digital loop filter when the absolute value of the phase error is smaller than the first default value (e.g., 0.5) in this embodiment. When the second digital loop filter continuously received three phase detection signals with the same state, the correspondingly output third second phase regulating signal has a phase inverse to those of the previous two second phase regulating signals. For example, when the second digital loop filter continuously received three phase lagging "−" signal between time T1 and T3, it will respectively output two forward regulation signals from time T2 to T3, and output a backward regulation "+" signal at time T4. The inverse second phase regulating signals outputted under this condition are specially marked by "o". In addition, the third digital loop filter counts the received second phase regulating signal, and outputs the corresponding third phase regulating signal to the phase adjusting unit when the count value is smaller than −3 (time T7) or greater than +3 (time T18). The phase regulation principle is to correspondingly regulate the phase of the sampling clock at next time (T8/T19). Therefore, the phase error falls between (+0.5) to (−0.5). Thus, it is possible to avoid the problem of the influence on the range of the phase error of the system owing to the conventional accumulative regulation caused by the time delay, and also to avoid the problem of the phase error divergence owing to the too-large range of the phase error.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for compensating a sampling phase error of a received signal, the method comprising:
   receiving the received signal and a sampling clock signal and thereby generating a plurality of phase detection signals, wherein each of the phase detection signals corresponds to a phase state and a phase error between the received signal and the sampling clock signal;
   outputting a first phase regulating signal according to the phase detection signals for fine regulation when an absolute value of the phase detection signal, indicating the phase error, is not larger than a first threshold value, wherein when a first number of the phase detection signals continuously represent a phase leading state, the first phase regulating signal includes at least one phase backward regulating signal and at least a phase non-backward regulating signal in order to prevent over-adjustment of the sampling clock signal, and when a second number of the phase detection signals continuously represent a phase lagging state, the first phase regulating signal includes at least one phase forward regulating signal and at least a phase non-forward regulating signal in order to prevent over-adjustment of the sampling clock signal; and
   adjusting the sampling clock signal according to the first phase regulating signal for the fine regulation;
   wherein the first number of phase detection signals and the second number of phase detection signals depend on a delay time from detection of a phase error between the received signal and the sampling clock signal to adjustment of the sampling clock signal for the phase error.

2. The method of claim 1, wherein the phase non-forward regulating signal is one of the phase backward regulating signal and a hold signal, and the phase non-backward regulating signal is one of the phase forward regulating signal and the hold signal.

3. The method of claim 1, further comprising:
   outputting a second phase regulating signal for coarse regulation when the absolute value of the phase detection signal is larger than the first threshold value; and
   adjusting the sampling clock signal according to the second phase regulating signal for the coarse regulation.

4. The method of claim 1, further comprising:
   counting the first phase regulating signal to output a counter value; and
   comparing the counter value with a second threshold to generate a third phase regulating signal;
   wherein the sampling clock signal is adjusted according to the third phase regulating signal.

5. The method of claim 1, wherein in the step of outputting the first phase regulating signal, when the first number of the phase detection signals continuously represent the phase leading state, the number of the at least one phase backward regulating signal is larger than the number of the at least a phase non-backward regulating signal.

6. The method of claim 1, wherein in the step of outputting the first phase regulating signal, when the second number of the phase detection signals continuously represent the phase lagging state, the number of the at least one phase forward regulating signal is larger than the number of the at least a phase non-forward regulating signal.

7. An apparatus for compensating a sampling phase error of a received signal, the apparatus comprising:

a phase detector to receive the received signal and a sampling clock signal, and thereby output a plurality of phase detection signals, wherein each of the phase detection signals corresponds to a phase state and a phase error between the received signal and the sampling clock signal;

a first phase regulating unit, coupled to the phase detector, to output a first phase regulating signal according to the phase detection signals for fine regulation when an absolute value of the phase detection signal, indicating the phase error, is not larger than a first threshold value, wherein in response to a first number of the phase detection signals continuously representing a phase leading state, the first phase regulating unit outputs the first phase regulating signal which includes at least one phase backward regulating signal and at least a phase non-backward regulating signal in order to prevent over-adjustment of the sampling clock signal, and in response to a second number of the phase detection signals continuously representing a phase lagging state, the first phase regulating unit outputs the first phase regulating signal which includes at least one phase forward regulating signal and at least a phase non-forward regulating signal in order to prevent over-adjustment of the sampling clock signal; and a phase adjusting unit, coupled between the phase detector and the first phase regulating unit, to adjust the sampling clock signal according to the first phase regulating signal for the fine regulation;

wherein the first number of phase detection signals and the second number of phase detection signals depend on a delay time from detection of a phase error between the received signal and the sampling clock signal to adjustment of the sampling clock signal for the phase error in the apparatus.

8. The apparatus of claim 7, wherein the phase non-forward regulating signal is one of the phase backward regulating signal and a hold signal, and the phase non-backward regulating signal is one of the phase forward regulating signal and the hold signal.

9. The apparatus of claim 7, further comprising:

a second phase regulating signal for coarse regulation, coupled between the phase detector and the phase adjusting unit, to output a second phase regulating signal when the absolute value of the phase detection signal is larger than the first threshold value;

wherein the phase adjusting unit adjusts the sampling clock signal according to the second phase regulating signal for the coarse regulation.

10. The apparatus of claim 9, further comprising:

a selector to receive the phase detection signal from the phase detector, and to selectively output the phase detection signal to the second phase regulating unit or the first phase regulating unit according to the absolute value of the phase detection signal.

11. The apparatus of claim 7, further comprising:

a loop filter, coupled between the first phase regulating unit and the phase adjusting unit, to count the first phase regulating signal to output a counter value, and to compare the counter value with a second threshold to generate a third phase regulating signal to the phase adjusting unit.

12. The apparatus of claim 11, further comprising:

a second phase regulating unit, coupled between the phase detector and the phase adjusting unit, to output a second phase regulating signal for coarse regulation when the absolute value of the phase detection signal is larger than the first threshold value;

wherein the phase adjusting unit adjusts the sampling clock signal according to the coarse phase regulating signal for the coarse regulation.

13. The apparatus of claim 12, further comprising:

a selector to receive the phase detection signal from the phase detector, and to selectively output the phase detection signal to the second phase regulating unit or the first phase regulating unit according to the absolute value of the phase detection signal.

14. The apparatus of claim 7, wherein in response to the first number of the phase detection signals continuously representing the phase leading state, the first phase regulating unit outputs the first phase regulating signal wherein the number of the at least one phase backward regulating signal is larger than the number of the at least a phase non-backward regulating signal.

15. The apparatus of claim 7, wherein in response to the second number of the phase detection signals continuously representing the phase lagging state, the first phase regulating unit outputs the first phase regulating signal wherein the number of the at least one phase forward regulating signal is larger than the number of the at least a phase non-forward regulating signal.

16. An apparatus for compensating a sampling phase error of a received signal, the apparatus comprising:

a phase detector to receive the received signal and a sampling clock signal, and thereby output a plurality of phase detection signals, wherein each of the phase detection signals corresponds to a phase state and a phase error between the received signal and the sampling clock signal;

a second phase regulating unit to output a second phase regulating signal according to the phase detection signals for coarse regulation;

a fine phase regulating unit to output a fine phase regulating signal according to the phase detection signals for fine regulation, wherein in response to a first number of the phase detection signals continuously representing a phase leading state, the first phase regulating unit outputs the first phase regulating signal which includes at least one phase backward regulating signal and at least a phase non-backward regulating signal in order to prevent over-adjustment of the sampling clock signal; and wherein in response to a second number of the phase detection signals continuously representing a phase lagging state, the first phase regulating unit outputs the first phase regulating signal which includes at least one phase forward regulating signal and at least a phase non-forward regulating signal in order to prevent over-adjustment of the sampling clock signal;

a digital loop filter, coupled to the first phase regulating unit, to count the first phase regulating signal to obtain a counter value, and to generate the first phase regulating signal when the counter value is not smaller than a specific threshold value; and a phase adjusting unit, coupled to the first phase regulating unit and the second phase regulating unit, to adjust the sampling clock signal according to the second phase regulating signal and the phase regulating signal;

wherein the first number of phase detection signals and the second number of phase detection signals depend on a delay time from detection of a phase error between the received signal and the sampling clock signal to adjustment of the sampling clock signal for the phase error in the apparatus, and the first number of phase detection signals and the second number of phase detection signals are not larger than the specific threshold value of the digital loop filter.

17. The apparatus of claim 16, wherein in response to the second number of the phase detection signals continuously representing the phase lagging state, the first regulating unit outputs the first phase regulating signal wherein the number of the at least one phase forward regulating signal is larger than the number of the at least a phase non-forward regulating signal.

18. The apparatus of claim 16, wherein in response to the first number of the phase detection signals continuously representing the phase leading state, the first regulating unit outputs the first phase regulating signal wherein the number of the at least one phase backward regulating signal is larger than the number of the at least a phase non-backward regulating signal.

19. The apparatus of claim 16, wherein the phase non-forward regulating signal is one of the phase backward regulating signal and a hold signal, and the phase non-backward regulating signal is one of the phase forward regulating signal and the hold signal.

20. The apparatus of claim 16, wherein:

the second phase regulating unit outputs a second phase regulating signal according to the phase detection signals when an absolute value of the phase detection signal is larger than a first threshold value; and the first phase regulating unit for fine regulation outputs the first phase regulating signal according to the phase detection signals when the absolute value of the phase detection signal is not larger than the first threshold value, wherein the absolute value indicates the phase error between the received signal and the sampling clock signal.

21. The apparatus of claim 16, further comprising:

a selector to receive the phase detection signals from the phase detector, and to output the phase detection signal to the second phase regulating unit or the first phase regulating unit selectively according to a absolute value of the phase detection signal, wherein the absolute value indicates the phase error.

* * * * *